US012581959B2

(12) United States Patent
Kim et al.

(10) Patent No.: US 12,581,959 B2
(45) Date of Patent: Mar. 17, 2026

(54) SEMICONDUCTOR DEVICE

(71) Applicant: Samsung Electronics Co., Ltd.,
Suwon-si (KR)

(72) Inventors: Jeonghyun Kim, Suwon-si (KR);
Sangjin Kim, Suwon-si (KR); **Yigwon
Kim, Seongnam-si (KR); Sungsik
Park, Hwaseong-si (KR); Jongsu Kim**,
Hwaseong-si (KR); Youngsik Park,
Hwaseong-si (KR); Jinseong Lee,
Hwaseong-si (KR); Hyekyoung Jue,
Ulsan (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 643 days.

(21) Appl. No.: 17/962,593

(22) Filed: Oct. 10, 2022

(65) Prior Publication Data

US 2023/0260925 A1      Aug. 17, 2023

(30) Foreign Application Priority Data

Feb. 15, 2022      (KR) ........................ 10-2022-0019534

(51) Int. Cl.
H01L 23/544             (2006.01)
(52) U.S. Cl.
CPC .. H01L 23/544 (2013.01); *H01L 2223/54426*
(2013.01)

(58) Field of Classification Search
None
See application file for complete search history.

(56) References Cited

U.S. PATENT DOCUMENTS

| | | | |
|---|---|---|---|
| 7,463,367 B2 | 12/2008 | Bowes | |
| 7,755,207 B2 | 7/2010 | Sogawa et al. | |
| 7,855,436 B2 | 12/2010 | Yonekawa | |
| 8,339,595 B2 | 12/2012 | Boef | |
| 2007/0069398 A1* | 3/2007 | Smith ................. | G03F 7/70633 |
| | | | 438/797 |
| 2009/0001521 A1* | 1/2009 | Yonekawa ............ | H01L 23/544 |
| | | | 257/E23.179 |
| 2009/0224413 A1* | 9/2009 | Ghinovker ......... | G01N 21/9501 |
| | | | 257/E23.179 |

FOREIGN PATENT DOCUMENTS

| | | |
|---|---|---|
| JP | 2010050148 A | 3/2010 |
| KR | 1020040107299 | 12/2004 |
| KR | 100896850 B1 | 5/2009 |
| KR | 1020100009835 A | 1/2010 |

* cited by examiner

*Primary Examiner* — Khaja Ahmad
(74) *Attorney, Agent, or Firm* — Muir Patent Law, PLLC

(57) ABSTRACT

A semiconductor device includes a substrate including an
overlay key region and a plurality of key patterns on the
overlay key region. The plurality of key patterns include first
to seventh key patterns. The second to seventh key patterns
are arranged to enclose the first key pattern in a clockwise
direction and to have center points forming a hexagonal
shape.

20 Claims, 13 Drawing Sheets

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2022-0019534, filed on Feb. 15, 2022, in the Korean Intellectual Property Office, the entire contents of which are hereby incorporated by reference.

BACKGROUND OF THE INVENTION

The present disclosure relates to a semiconductor device including an overlay key.

Due to their small-sized, multifunctional, and/or low-cost characteristics, semiconductor devices are being esteemed as important elements in the electronics industry. The semiconductor devices are classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet this demand, structural complexity and/or integration density of semiconductor devices are being increased.

As an integration density of a semiconductor device increases, a density of patterns formed on a unit area of a substrate increases. In addition, as a semiconductor device with multiple functions and high performance is required, the number of layers formed on the substrate increases. Accordingly, a fabrication process of the semiconductor device should be performed to accurately form patterns at desired positions. An alignment key or an overlay key is used to realize an accurate alignment between layers stacked on a substrate.

SUMMARY

An embodiment of the inventive concept provides a semiconductor device with an increased integration density and improved reliability.

According to an embodiment of the inventive concept, a semiconductor device may include a substrate including an overlay key region and a plurality of key patterns on the overlay key region. The key patterns may include first to seventh key patterns. The second to seventh key patterns may be arranged to enclose the first key pattern in a clockwise direction and to have center points forming a hexagonal shape.

According to an embodiment of the inventive concept, a semiconductor device may include a substrate including an overlay key region and a plurality of key patterns on the overlay key region. The plurality of key patterns may include a first column including first key patterns arranged in a first direction and a second column including second key patterns arranged in the first direction. The second column may be offset from the first column in a second direction by a first distance. The second key pattern of the second column may be offset from the first key pattern of the first column corresponding thereto in the first direction by a second distance. A ratio of the first distance to the second distance may range from 1.4 to 1.8.

According to an embodiment of the inventive concept, a semiconductor device may include a substrate including a logic cell region and an overlay key region, an active pattern on the logic cell region, a source/drain pattern and a channel pattern on the active pattern, a gate electrode crossing the channel pattern, an active contact electrically connected to the source/drain pattern, a gate contact electrically connected to the gate electrode, a first metal layer electrically connected to the active contact and the gate contact, a second metal layer on the first metal layer, and a plurality of key patterns on the overlay key region. A plurality of unit key regions may be defined by boundaries between the plurality of key patterns. The plurality of key patterns may be disposed in the unit key regions, respectively, and each of the unit key regions may have a hexagonal shape.

DETAILED DESCRIPTION

Example embodiments of the inventive concepts will now be described more fully with reference to the accompanying drawings, in which example embodiments are shown. Like numbers refer to like elements throughout.

Figure 1:
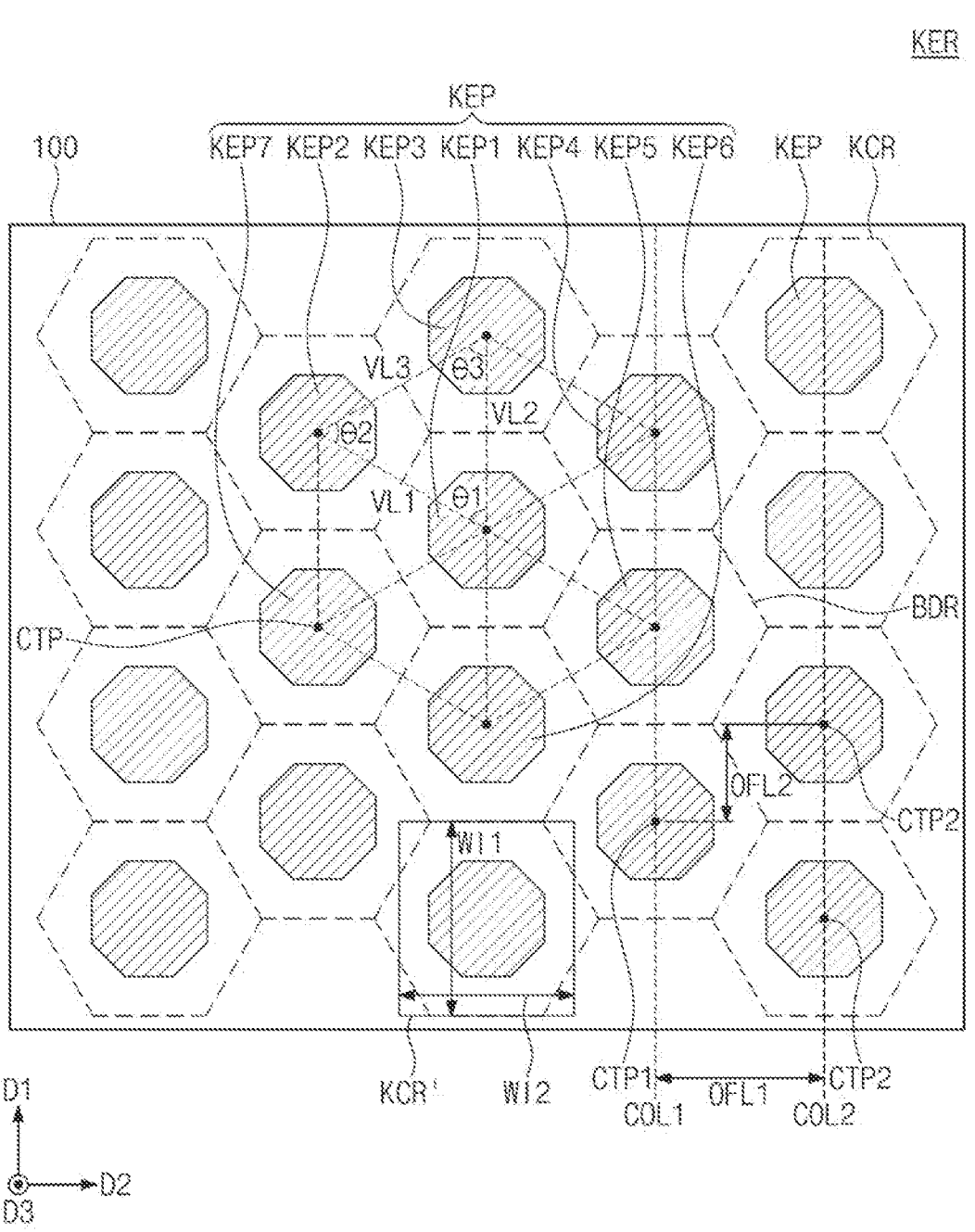
FIG. 1 is a plan view illustrating an overlay key region according to an example embodiment of the inventive concept.

FIG. 1 is a plan view illustrating an overlay key region according to an example embodiment of the inventive concept.

Referring to FIG. 1, a substrate 100 including an overlay key region KER may be provided. A plurality of key patterns KEP may be disposed on the overlay key region KER. The key patterns KEP may be two-dimensionally arranged at a specific pitch. The key patterns KEP may be arranged in a honeycomb shape, under a specific rule.

Each of the key patterns KEP may be provided in a unit key region KCR. The unit key region KCR may be a region enclosing the key pattern KEP. The unit key region KCR may be a unit cell of the key pattern KEP in the overlay key region KER. One key pattern KEP may be provided in one of the unit key regions KCR. The key pattern KEP may be disposed at a center of the unit key region KCR.

In the present embodiment, the key pattern KEP may have an octagonal shape. However, the shape of the key pattern KEP is not limited to this example and may be variously changed (e.g., see FIGS. 4A and 4B).

A boundary BDR may be defined between adjacent ones of the key patterns KEP. The boundary BDR may be a border of the unit key region KCR. A planar shape of the unit key region KCR may be a hexagon. The unit key regions KCR may be disposed such that the borders BDR thereof are in contact with each other. Thus, the unit key regions KCR may be arranged in a honeycomb shape. The unit key regions KCR, which are arranged in this manner, may constitute the overlay key region KER of FIG. 1.

In an embodiment, the key patterns KEP of FIG. 1 may include first to seventh key patterns KEP1-KEP7. The second to seventh key patterns KEP2-KEP7 may be arranged around the first key pattern KEP1 to enclose the first key pattern KEP1 in a clockwise direction.

A center point CTP may be defined at a center of each of the first to seventh key patterns KEP1-KEP7. Six triangles may be defined by lines, which are drawn to connect the center points CTP of the first to seventh key patterns KEP1-KEP7 to each other. The six triangles may constitute one hexagon. For example, the hexagon may be defined by lines connecting the center points CTP of the second to seventh key patterns KEP2-KEP7.

In an embodiment, a first virtual line VL1 may be defined to connect the center point CTP of the first key pattern KEP1 to the center point CTP of the second key pattern KEP2. A second virtual line VL2 may be defined to connect the center point CTP of the first key pattern KEP1 to the center point CTP of the third key pattern KEP3. A third virtual line VL3 may be defined to connect the center point CTP of the second key pattern KEP2 to the center point CTP of the third key pattern KEP3.

A length of the first virtual line VL1 may be substantially equal to a length of the third virtual line VL3. The length of the first virtual line VL1 may be equal to or different from a length of the second virtual line VL2. A first angle $\theta 1$ may be defined between the first virtual line VL1 and the second virtual line VL2. A second angle $\theta 2$ may be defined between the first virtual line VL1 and the third virtual line VL3. A third angle $\theta 3$ may be defined between the second virtual line VL2 and the third virtual line VL3. The first angle $\theta 1$ may be substantially equal to the third angle $\theta 3$. The second angle $\theta 2$ may be equal to or different from the first angle $\theta 1$. As an example, the second angle $\theta 2$ may range from 30° to 90°.

Terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The triangle, which is defined by the first to third virtual line VL1, VL2, and VL3, may be an isosceles triangle, in which the first and third virtual lines VL1 and VL3 have the same length. Alternatively, the triangle may be a regular or equilateral triangle.

In an embodiment, the hexagonal unit key region KCR may be reduced to a rectangular unit key region KCR' of the same area. For example, the area of the rectangular unit key region KCR' of FIG. 1 may be equal to the area of the hexagonal unit key region KCR.

The rectangular unit key region KCR' may have a first width WI1 in a first direction D1 and a second width WI2 in a second direction D2. The first direction D1 and the second direction D2 may be perpendicular to one another. The first width WI1 may be equal to a length in the first direction D1 of the hexagonal unit key region KCR. The first width WI1 may be equal to the length of the second virtual line VL2. For example, the first width WI1 may be equal to a pitch between the key patterns KEP.

The second width WI2 may be smaller than the first width WI1. The second width WI2 may be smaller than a length of the hexagonal unit key region KCR in the second direction D2. A ratio WI2/WI1 of the second width WI2 to the first width WI1 may range from 0.7 to 0.9.

An area of the overlay key region KER may be equal to a product of the number of the key patterns KEP and the area of the unit key region KCR. For example, the area of the overlay key region KER may be proportional to the area of the unit key region KCR. The smaller the area of the unit key region KCR, the smaller the area of the overlay key region KER.

According to the present embodiment, for the rectangular unit key region KCR', since the second width WI2 is smaller than the first width WI1, the area of the rectangular unit key region KCR' may be relatively decreased. Accordingly, the area of the overlay key region KER may be reduced, and this will be described in more detail with reference to FIG. 3A.

The key patterns KEP may constitute columns, each of which includes a plurality of key patterns KEP arranged in the first direction D1. For example, the key patterns KEP, which are arranged in the first direction D1, may constitute a first column COL1, and the key patterns KEP, which are adjacent to the first column COL1 in the second direction D2, may constitute a second column COL2. The first column COL1 and the second column COL2 may be repeatedly disposed in the second direction D2, and in this case, the key patterns KEP may be arranged to form the afore-described honeycomb shape.

For example, one of the key patterns KEP in the first column COL1 may have a first center point CTP1. A corresponding one of the key patterns KEP in the second column COL2, which is adjacent to the one of the key patterns KEP in the first column COL1, may have a second center point CTP2.

The second column COL2 may be offset from the first column COL1 in the second direction D2 by a first distance OFL1. In detail, the first distance OFL1 may be a measure representing the offset between the second center point CTP2 of the key pattern KEP of the second column COL2 and the first center point CTP1 of the key pattern KEP of the first column COL1 in the second direction D2. The first distance OFL1 may be equal to the second width WI2 of the rectangular unit key region KCR'.

The key patterns KEP of the second column COL2 may be respectively offset from the key patterns KEP of the first column COL1 in the first direction D1 by a second distance OFL2. In detail, the second distance OFL2 may be a measure representing the offset between the second center point CTP2 of the key pattern KEP of the second column COL2 and the first center point CTP1 of the key pattern KEP of the first column COL1 in the first direction D1. The second distance OFL2 may be half of the first width WI1 of the rectangular unit key region KCR'.

The first distance OFL1 may be larger than the second distance OFL2. The first distance OFL1 may be larger than the second distance OFL2 but may be smaller than two times of the second distance OFL2. In an embodiment, a ratio OFL1/OFL2 of the first distance OFL1 to the second distance OFL2 may range from 1.4 to 1.8.

In the present embodiment, since the ratio OFL1/OFL2 ranges from 1.4 to 1.8, the arrangement shape of the key patterns KEP may be close to a regular hexagon. Accordingly, it may be possible to minimize the area of the overlay key region KER and to maximize a distance between adjacent ones of the key patterns KEP.

The key patterns KEP may be placed in different layers from each other. For example, at least one of the first to seventh key patterns KEP1-KEP7 may be placed in a front-end-of-line (FEOL) layer, another of the first to seventh key patterns KEP1-KEP7 may be placed in a middle-of-line (MOL) layer, and other of the first to seventh key patterns KEP1-KEP7 may be placed in a back-end-of-line (BEOL) layer. For example, the key patterns KEP according to the present embodiment may be arranged to be adjacent to each other and to form a honeycomb shape, when viewed in a plan view, but may be placed at vertically-different levels.

Figure 2:
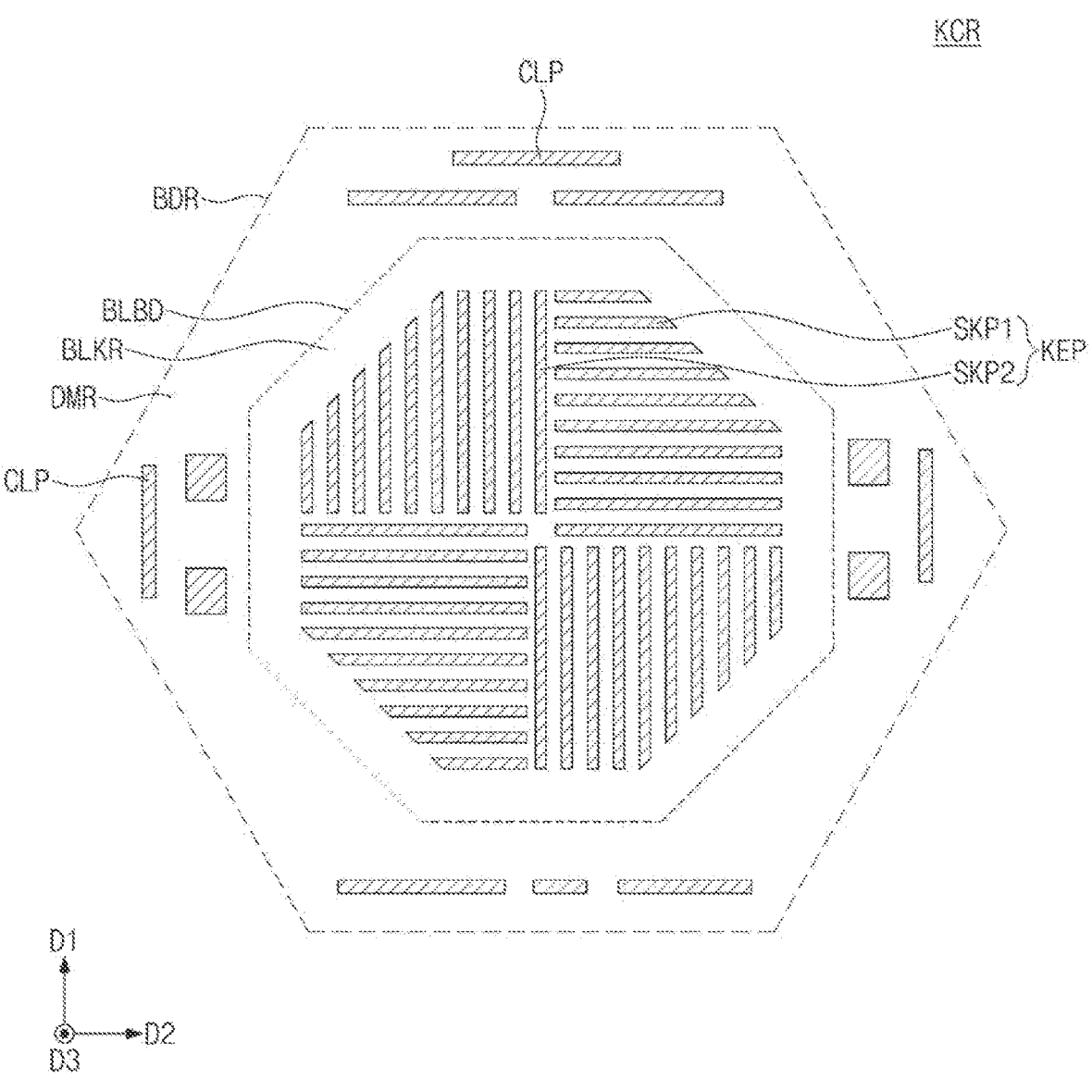
FIG. 2 is a plan view illustrating one of unit key regions of FIG. 1.

FIG. 2 is a plan view illustrating one of unit key regions of FIG. 1. Referring to FIG. 2, the unit key region KCR may include the key pattern KEP provided at a center thereof. The key pattern KEP may include a plurality of first sub-key patterns SKP1 and a plurality of second sub-key patterns SKP2. For example, the first sub-key patterns SKP1 may be bar-shaped patterns extending lengthwise in the second direction D2. The second sub-key patterns SKP2 may be bar-shaped patterns extending lengthwise in the first direction D1. Each key pattern KEP may be composed of a combination of the first and second sub-key patterns SKP1 and SKP2.

A blank region BLKR may be defined around the key pattern KEP. More specifically, a blank boundary BLBD may be placed to define the blank region BLKR around the key pattern KEP. The blank boundary BLBD may be an imaginary boundary. An empty region, which does not have any pattern, may be provided between the blank boundary BLBD and the key pattern KEP.

The blank boundary BLBD may have a shape corresponding to the key pattern KEP. Since the key pattern KEP according to the present embodiment has an octagonal shape, the blank boundary BLBD may also have an octagonal shape.

A dummy region DMR may be provided between the blank boundary BLBD and the boundary BDR of the unit key region KCR. Dummy patterns CLP may be disposed in the dummy region DMR. For example, the dummy patterns CLP may include a cell-like pattern, which has the same shape as a cell pattern that is formed when a layer of the key pattern KEP is formed. The dummy patterns CLP may include a test element group (TEG) pattern. The dummy patterns CLP may be spaced apart from the key pattern KEP with the blank region BLKR interposed therebetween.

Figure 3A:
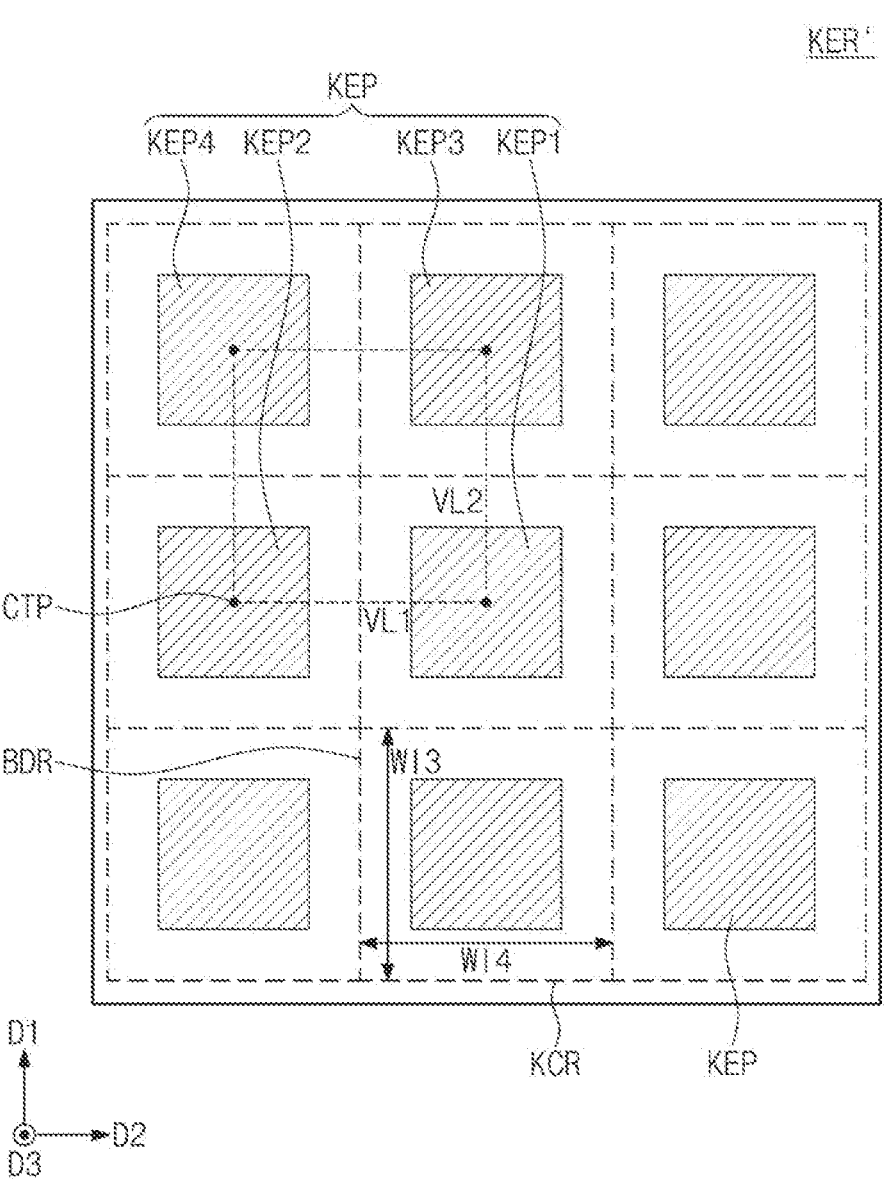
FIG. 3A is a plan view illustrating an overlay key region according to a comparative example.

FIG. 3A is a plan view illustrating an overlay key region according to a comparative example. Referring to FIG. 3A, the key patterns KEP may be two-dimensionally arranged on the overlay key region KER' according to the present comparative example. The key patterns KEP according to the present comparative example may be disposed to form a checkerboard shape in the first and second directions D1 and D2.

As an example, the key patterns KEP may include first to fourth key patterns KEP1-KEP4. A tetragon or rectangle may be defined by lines connecting the center points CTP of the first to fourth key patterns KEP1-KEP4. For example, the key patterns KEP according to the comparative example may be arranged to form a rectangular checkerboard shape.

The first virtual line VL1 may be defined to connect the center point CTP of the first key pattern KEP1 to the center point CTP of the second key pattern KEP2. The second virtual line VL2 may be defined to connect the center point CTP of the first key pattern KEP1 to the center point CTP of the third key pattern KEP3. The first virtual line VL1 may be parallel to the second direction D2, and the second virtual line VL2 may be parallel to the first direction D1. The first virtual line VL1 and the second virtual line VL2 may be orthogonal to each other. A length of the first virtual line VL1 and a length of the second virtual line VL2 may be substantially equal to each other. The length of the first virtual line VL1 in the present comparative example may be equal to the length of the first virtual line VL1 of FIG. 1.

In the present comparative example, the key patterns KEP may be arranged at a first pitch in the first or second direction D1 or D2. The first pitch between the key patterns KEP may be equal to the length of the first virtual line VL1 or the length of the second virtual line VL2. A distance between the key patterns KEP according to the present comparative example may be substantially equal to the distance between the key patterns KEP in the embodiment previously described with reference to FIG. 1.

In the present comparative example, the key pattern KEP may be provided in the rectangular unit key region KCR. The unit key region KCR may have a third width WI3 in the first direction D1 and a fourth width WI4 in the second direction D2. The third width WI3 may be equal to the length of the second virtual line VL2, and the fourth width WI4 may be equal to the length of the first virtual line VL1. The third width WI3 may be equal to the fourth width WI4. For example, the unit key region KCR according to the present comparative example may have a square shape.

The unit key regions KCR according to the present comparative example may be disposed such that the borders BDR thereof are in contact with each other. In this case, the unit key regions KCR may be arranged to form a checkerboard shape.

Referring back to FIGS. 1 and 3A, an area of the rectangular unit key region KCR' of FIG. 1 may be smaller than that of the unit key region KCR of FIG. 3A. In detail, the first width WI1 of the rectangular unit key region KCR' of FIG. 1 may be equal to the third width WI3 of the unit key region KCR of FIG. 3A. However, the second width WI2 of the rectangular unit key region KCR' of FIG. 1 may be smaller than the fourth width WI4 of the unit key region KCR of FIG. 3A.

A distance between the center points CTP of adjacent ones of the key patterns KEP of FIG. 1 may be equal to a distance between the center points CTP of adjacent ones of the key patterns KEP' of FIG. 3A. For example, a pitch or distance between adjacent one of the key patterns KEP in the embodiment of FIG. 1 may be equal to that in the comparative example of FIG. 3A. However, an area of the unit key region KCR of FIG. 1 may be smaller than an area of the unit key region KCR of FIG. 3A. As a result, the area of the overlay key region KER in the present embodiment may be smaller than the area of the overlay key region KER' in the comparative example.

According to an example embodiment of the inventive concept, since the key patterns KEP are arranged in a honeycomb shape, the area of the overlay key region KER may be decreased even when the distance between the key patterns KEP is unchanged. Thus, it may be possible to relatively reduce the area of the overlay key region KER and thereby to increase an integration density of the semiconductor device.

Figure 3B:
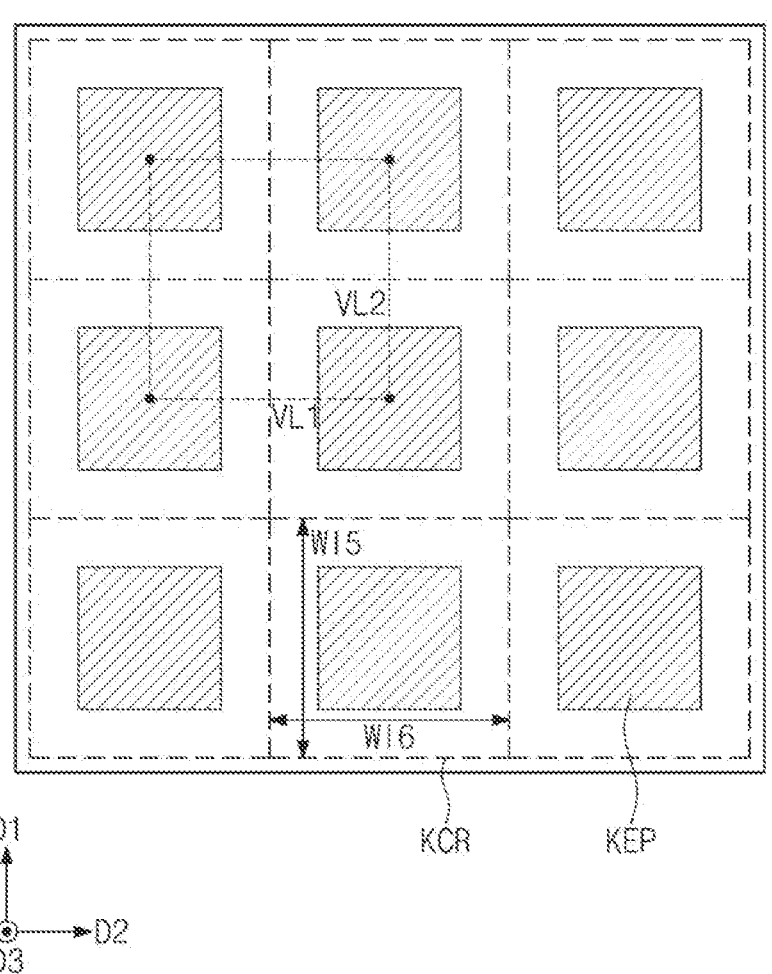
FIG. 3B is a plan view illustrating an overlay key region according to another comparative example.

FIG. 3B is a plan view illustrating an overlay key region according to another comparative example. Referring to FIG. 3B, the key patterns KEP may be two-dimensionally arranged on an overlay key region KER" according to the present comparative example. The key patterns KEP according to the present comparative example may be disposed to form a checkerboard shape in the first and second directions D1 and D2.

The unit key region KCR according to the present comparative example may be defined to have the same area as the rectangular unit key region KCR' of FIG. 3A. In detail, the unit key region KCR in the present comparative example may have a fifth width WI5 in the first direction D1 and a sixth width WI6 in the second direction D2. The fifth width WI5 may be equal to the sixth width WI6. A product of the fifth width WI5 and the sixth width WI6 may be equal to a product of the first width WI1 and the second width WI2 of FIG. 1. For example, an area of the unit key region KCR of FIG. 3B may be equal to the area of the rectangular unit key region KCR' of FIG. 3A.

In the present comparative example, the key patterns KEP may be arranged at a second pitch in the first or second direction D1 or D2. The second pitch between the key patterns KEP may be the same as a distance between the center points CTP of the key patterns KEP. For example, the second pitch between the key patterns KEP may be equal to the length of the first or second virtual line VL1 or VL2 of FIG. 3B.

The length of the first virtual line VL1 of FIG. 3B may be smaller than the length of the first virtual line VL1 of FIG. 1. The length of the second virtual line VL2 of FIG. 3B may be smaller than the length of the second virtual line VL2 of FIG. 1.

The second pitch between the key patterns KEP may be smaller than the first pitch previously described with reference to FIG. 3A. The second pitch between the key patterns KEP may be smaller than the pitch between the key patterns KEP of FIG. 1. For example, the second pitch between the key patterns KEP may be smaller than the length of the first or second virtual line VL1 or VL2 of FIG. 1.

Referring back to FIGS. 1 and 3B, the area of the unit key region KCR of FIG. 3B may be equal to the area of the unit key region KCR of FIG. 1. That is, if the number of the key patterns KEP is unchanged, an area of the overlay key region KER" of FIG. 3B may be equal to the area of the overlay key region KER of FIG. 1. However, a distance between adjacent ones of the key patterns KEP of FIG. 3B may be smaller than a distance between adjacent ones of the key patterns KEP of FIG. 1. Due to this small distance between the key patterns KEP, adjacent ones of the key patterns KEP in the comparative example of FIG. 3B may not be accurately recognized by an inspection system, and this may lead to a failure in a subsequent process.

According to the embodiment shown in FIG. 1, it may be possible to maximize the distance between the key patterns KEP, even when the area of the overlay key region KER is unchanged. Thus, due to this increase in the distance between the key patterns KEP, the key patterns KEP may be accurately recognized by an inspection system during a semiconductor fabrication process. As a result, it may be possible to improve reliability in the semiconductor fabrication process.

Figure 4A:
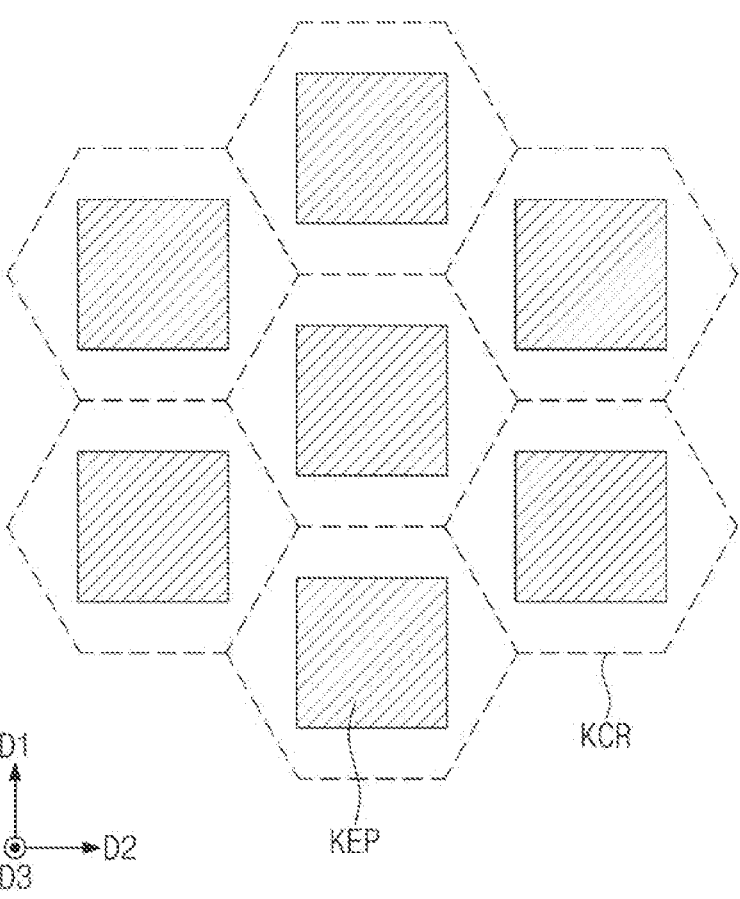
FIGS. 4A and 4B are plan views, each of which illustrates key patterns according to an example embodiment of the inventive concept.
Figure 4B:
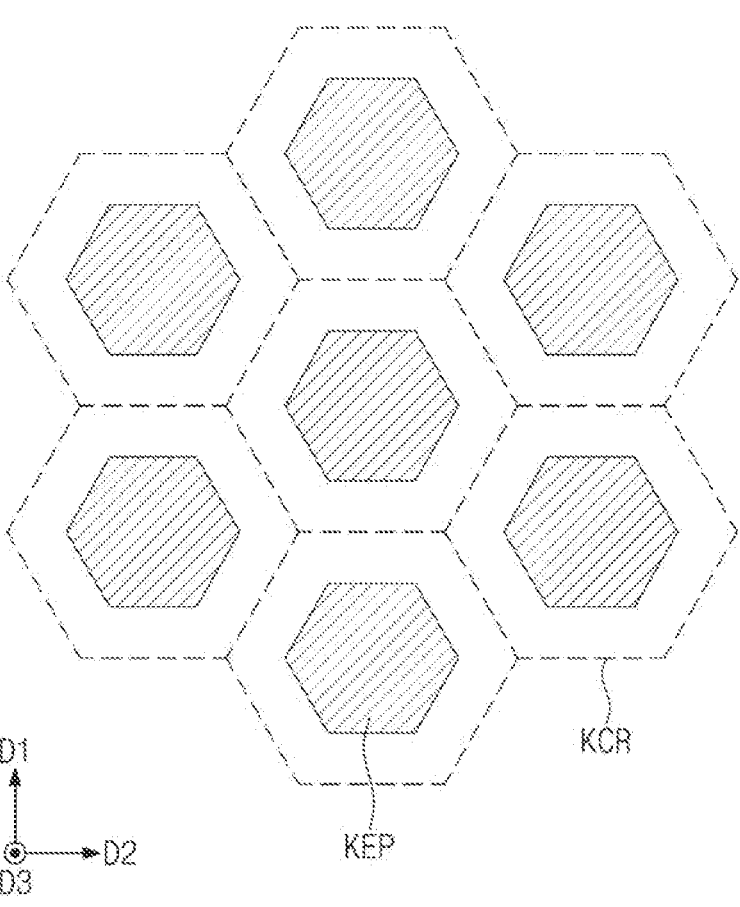

FIGS. 4A and 4B are plan views, each of which illustrates key patterns according to an example embodiment of the inventive concept. Referring to FIG. 4A, each of the key patterns KEP may have a tetragonal or rectangular shape. Referring to FIG. 4B, each of the key patterns KEP may have a hexagonal shape. According to an example embodiment of the inventive concept, the unit key region KCR may have a hexagonal shape, regardless of the shape of the key pattern KEP. The unit key region KCR may be provided to enclose the polygonal key pattern KEP placed at the center thereof. The hexagonal unit key regions KCR may be arranged such that the borders BDR thereof are in contact with each other, and thus, the key patterns KEP may be arranged to form a honeycomb shape.

Figure 5:
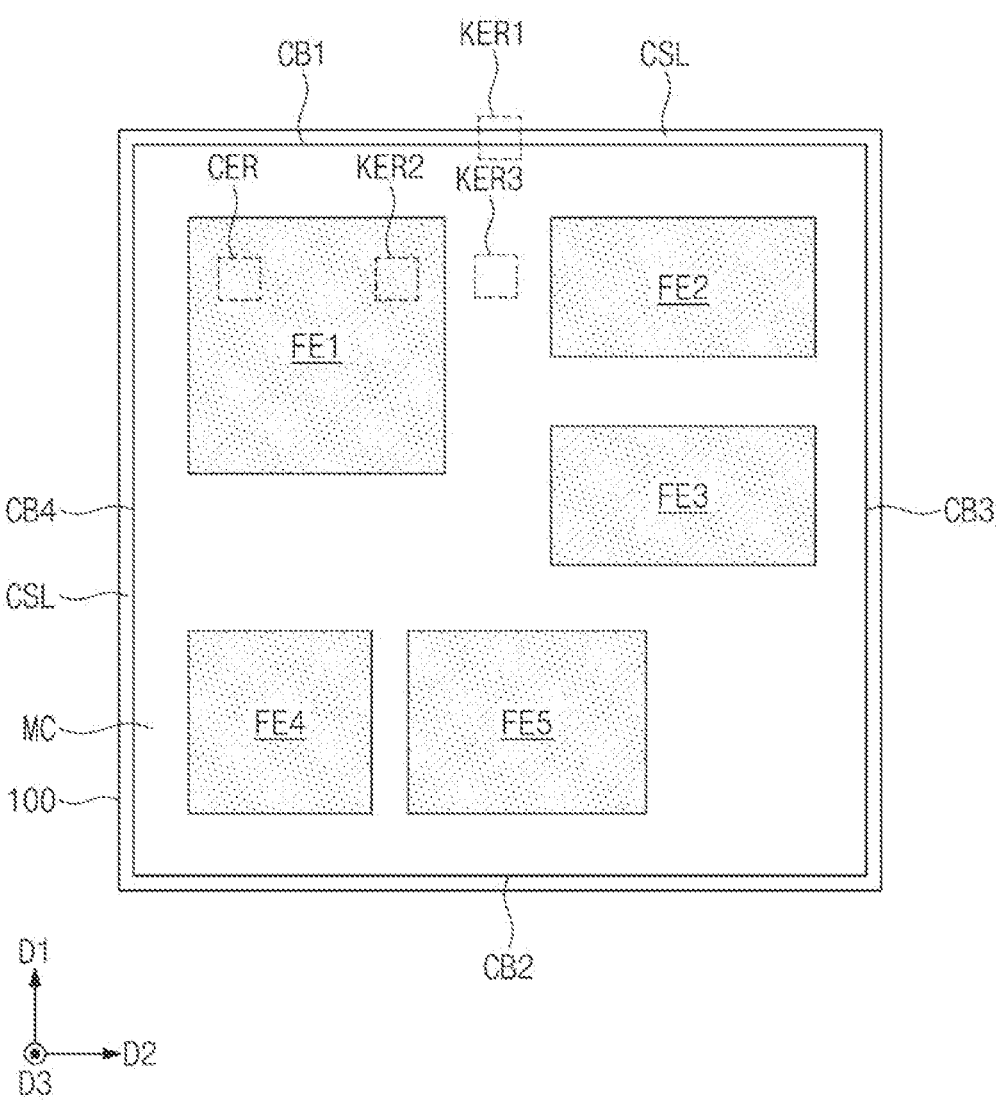
FIG. 5 is a plan view illustrating a semiconductor device according to an example embodiment of the inventive concept.

FIG. 5 is a plan view illustrating a semiconductor device according to an example embodiment of the inventive concept. Referring to FIG. 5, the semiconductor device may include a main chip MC and a cut scribe lane CSL enclosing the main chip MC. The main chip MC may include first to fifth functional units FE1-FE5, which are integrated on the substrate 100. The substrate 100 may be a diced portion of a semiconductor wafer. The substrate 100 may support the first to fifth functional units FE1-FE5.

The main chip MC may include first to fourth boundaries CB1-CB4. The first to fourth boundaries CB1-CB4 may be defined between the cut scribe lane CSL and the main chip MC. The cut scribe lane CSL may enclose the first to fourth boundaries CB1-CB4 of the main chip MC. In an embodiment, the cut scribe lane CSL may include a first overlay key region KER1, which is provided to be adjacent to the first boundary CB1 of the main chip MC. For example, the first overlay key region KER1 may be left on the cut scribe lane CSL, even after a dicing process on the wafer.

Each of the first to fifth functional units FE1-FE5 may be a functional block constituting an integrated circuit. Each of the first to fifth functional units FE1-FE5 may include one of a memory block, an analog logic block, an input/output (I/O) logic block, a central processing unit (CPU) block, and a radio frequency block.

In an embodiment, the first functional unit FE1 may include a logic cell region CER and a second overlay key region KER2. For example, the overlay key region may be provided not only in the scribe lane but also the functional block. The third overlay key region KER3 may be provided in a region between the first functional unit FE1 and the second functional unit FE2.

Each of the first to third overlay key regions KER1, KER2, and KER3 may be substantially the same as the overlay key region KER previously described with reference to FIG. 1. At least one of the first to third overlay key regions KER1, KER2, and KER3 mentioned above may be omitted from a semiconductor device (i.e., a semiconductor chip).

Figure 6:
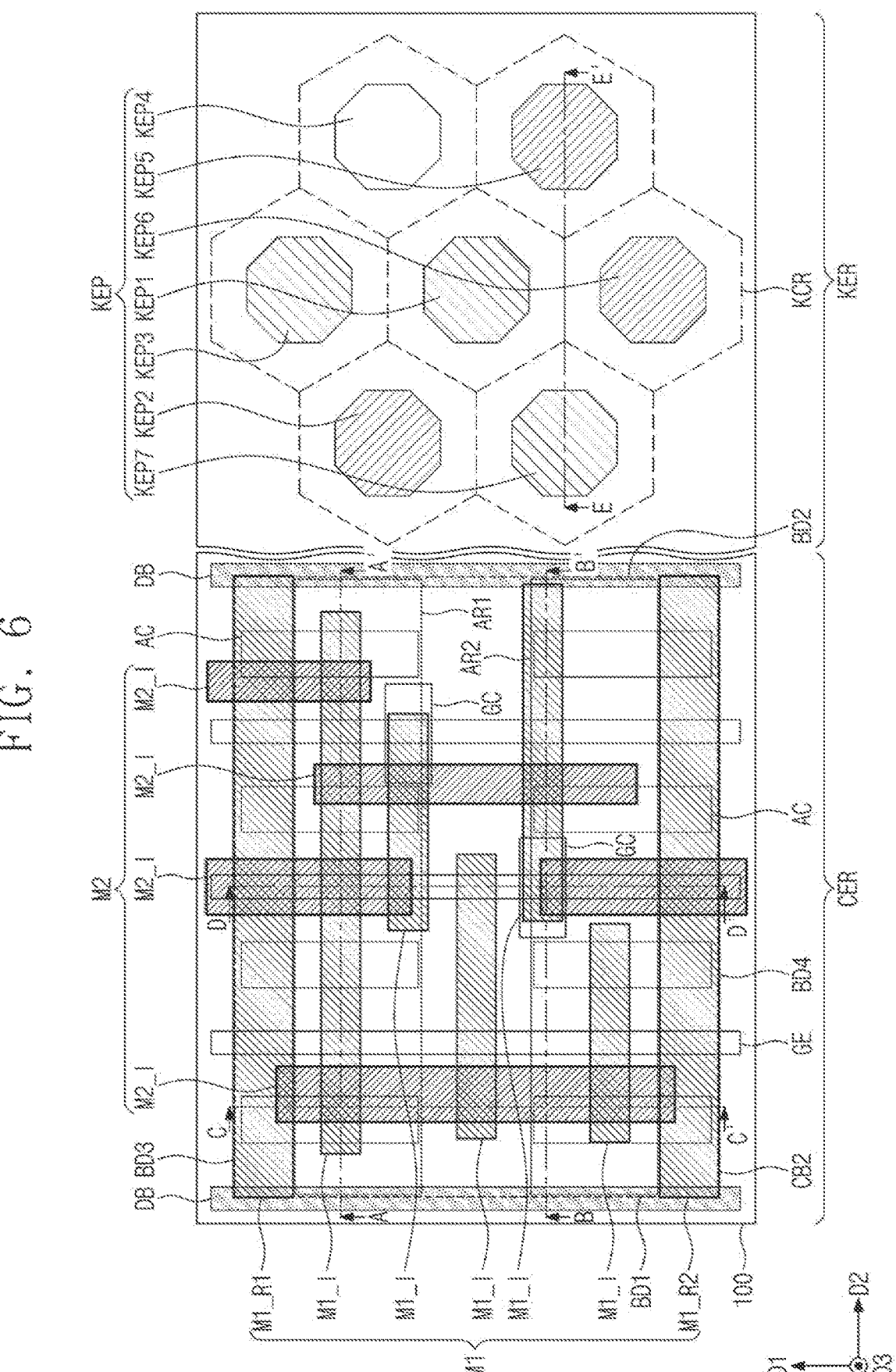
FIG. 6 is a plan view illustrating a semiconductor device according to an example embodiment of the inventive concept and in particular illustrating a logic cell region and an overlay key region of FIG. 5.

FIG. 6 is a plan view illustrating a semiconductor device according to an example embodiment of the inventive concept and in particular illustrating a logic cell region and an overlay key region of FIG. 5. FIGS. 7A to 7E are sectional views illustrating lines A-A', B-B', C-C', D-D', and E-E' of FIG. 6.

Referring to FIGS. 5, 6, and 7A to 7E, the first functional unit FE1 of the semiconductor chip of FIG. 5 may include the logic cell region CER. The overlay key region KER of one of the first to third overlay key regions KER1, KER2, and KER3 of the semiconductor chip of FIG. 5 is exemplarily illustrated in FIG. 6.

In an embodiment, the overlay key region KER of FIG. 6 may be the first overlay key region KER1, which is provided in the cut scribe lane CSL of FIG. 5. In another embodiment, the overlay key region KER of FIG. 6 may be the second overlay key region KER2 provided in the first functional unit FE1 of FIG. 5. In other embodiment, the overlay key region KER of FIG. 6 may be the third overlay key region KER3, which is provided between the first and second functional units FE1 and FE2 of FIG. 5.

The logic cell region CER provided on the substrate 100 may be first described in more detail. Referring to FIGS. 6 and 7A to 7D, the logic cell region CER may include a logic cell including a logic circuit (e.g., AND, OR, XOR, XNOR, or inverter circuit), which is configured for a specific function. For example, the logic cell of the logic cell region CER may include transistors constituting the logic device and interconnection lines connecting transistors to each other.

The substrate 100 may be a semiconductor substrate that is formed of or includes silicon, germanium, silicon germanium, a compound semiconductor material, or the like. In an embodiment, the substrate 100 may be a silicon wafer.

The substrate 100 may include a first active region AR1 and a second active region AR2. Each of the first and second active regions AR1 and AR2 may be extended lengthwise in the second direction D2. In an embodiment, the first active region AR1 may be an NMOSFET region, and the second active region AR2 may be a PMOSFET region.

A first active pattern AP1 and a second active pattern AP2 may be defined by a trench TR, which is formed in an upper portion of the substrate 100. The first active pattern AP1 may be provided on the first active region AR1, and the second active pattern AP2 may be provided on the second active region AR2. The first and second active patterns AP1 and AP2 may be extended lengthwise in the second direction D2. Each of the first and second active patterns AP1 and AP2 may be a vertically-protruding portion of the substrate 100.

A device isolation layer ST may be provided on the substrate 100. The device isolation layer ST may be provided to fill the trench TR. The device isolation layer ST may include a silicon oxide layer. The device isolation layer ST may not cover first and second channel patterns CH1 and CH2 to be described below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or may include at least one of silicon (Si), germanium (Ge), or silicon germanium (SiGe). For example, each of the first to third semiconductor patterns SP1, SP2, and SP3 may be formed of or may include crystalline silicon.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., n-type). The first channel pattern CH1 may be interposed between each pair of the first source/drain patterns SD1. For example, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., p-type). The second channel pattern CH2 may be interposed between each pair of the second source/drain patterns SD2. For example, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, each of the first and second source/drain patterns SD1 and SD2 may have a top surface that is higher than a top surface of the third semiconductor pattern SP3. In another embodiment, a top surface of at least one of the first and second source/drain patterns SD1 and SD2 may be located at substantially the same level as the top surface of the third semiconductor pattern SP3.

In an embodiment, the first source/drain patterns SD1 may be formed of or may include the same semiconductor element (e.g., Si) as the substrate 100. The second source/drain patterns SD2 may include a semiconductor material (e.g., SiGe) whose lattice constant is greater than that of the substrate 100. In this case, the pair of the second source/drain patterns SD2 may exert a compressive stress on the second channel pattern CH2 therebetween.

A side surface of each of the first and second source/drain patterns SD1 and SD2 may have an uneven or embossing shape. For example, the side surface of each of the first and second source/drain patterns SD1 and SD2 may have a wavy profile. The side surface of each of the first and second source/drain patterns SD1 and SD2 may protrude toward first to third portions PO1, PO2, and PO3 of a gate electrode GE, which will be described below.

Gate electrodes GE may be provided to cross the first and second channel patterns CH1 and CH2 and to extend lengthwise in the first direction D1. The gate electrodes GE may be arranged at a first pitch in the second direction D2. Each of the gate electrodes GE may be vertically overlapped with the first and second channel patterns CH1 and CH2.

The gate electrode GE may include a first portion PO1 interposed between the active pattern AP1 or AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Figure 7A:
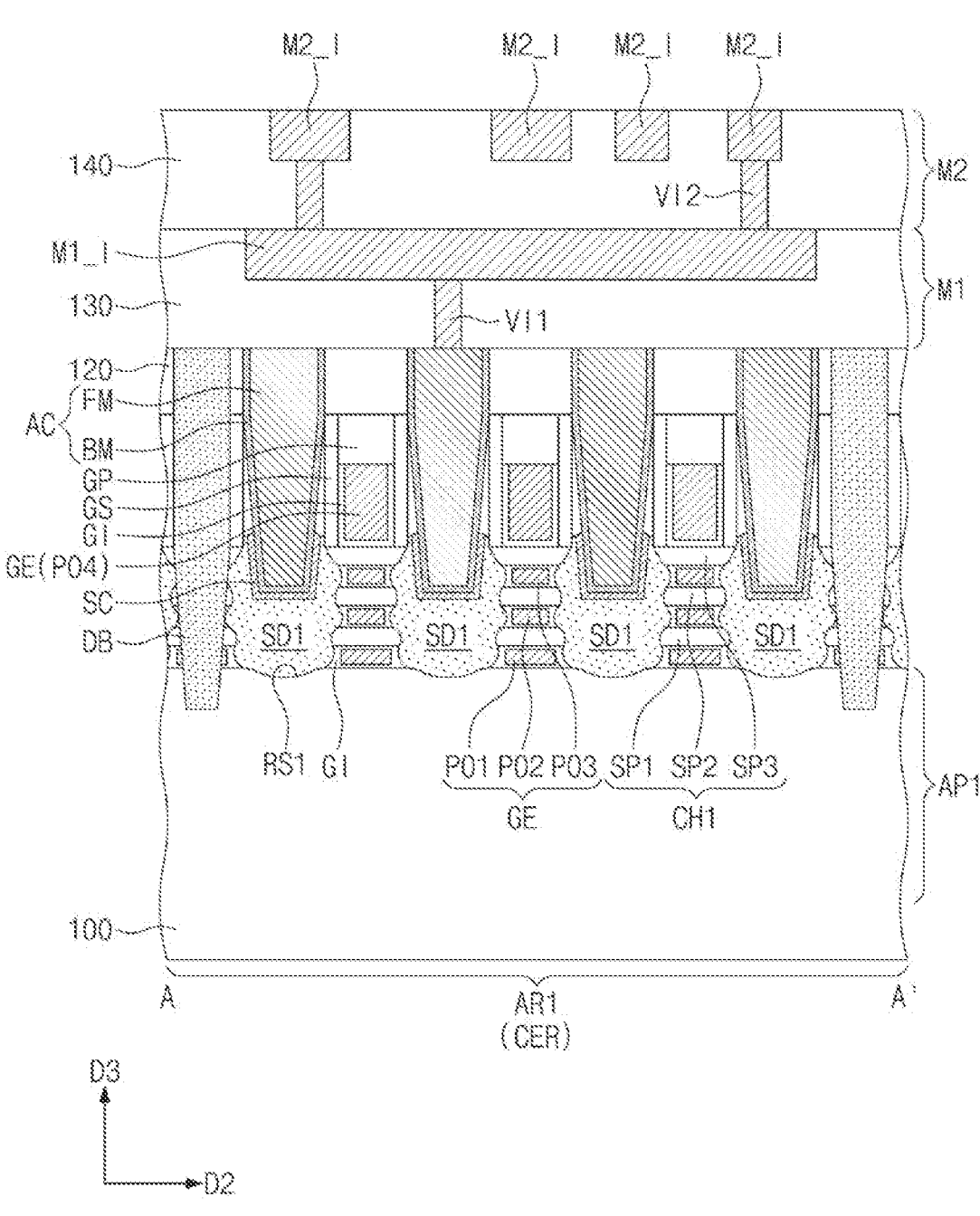
FIGS. 7A to 7E are sectional views illustrating lines A-A', B-B', C-C', D-D', and E-E' of FIG. 6.
Figure 7B:
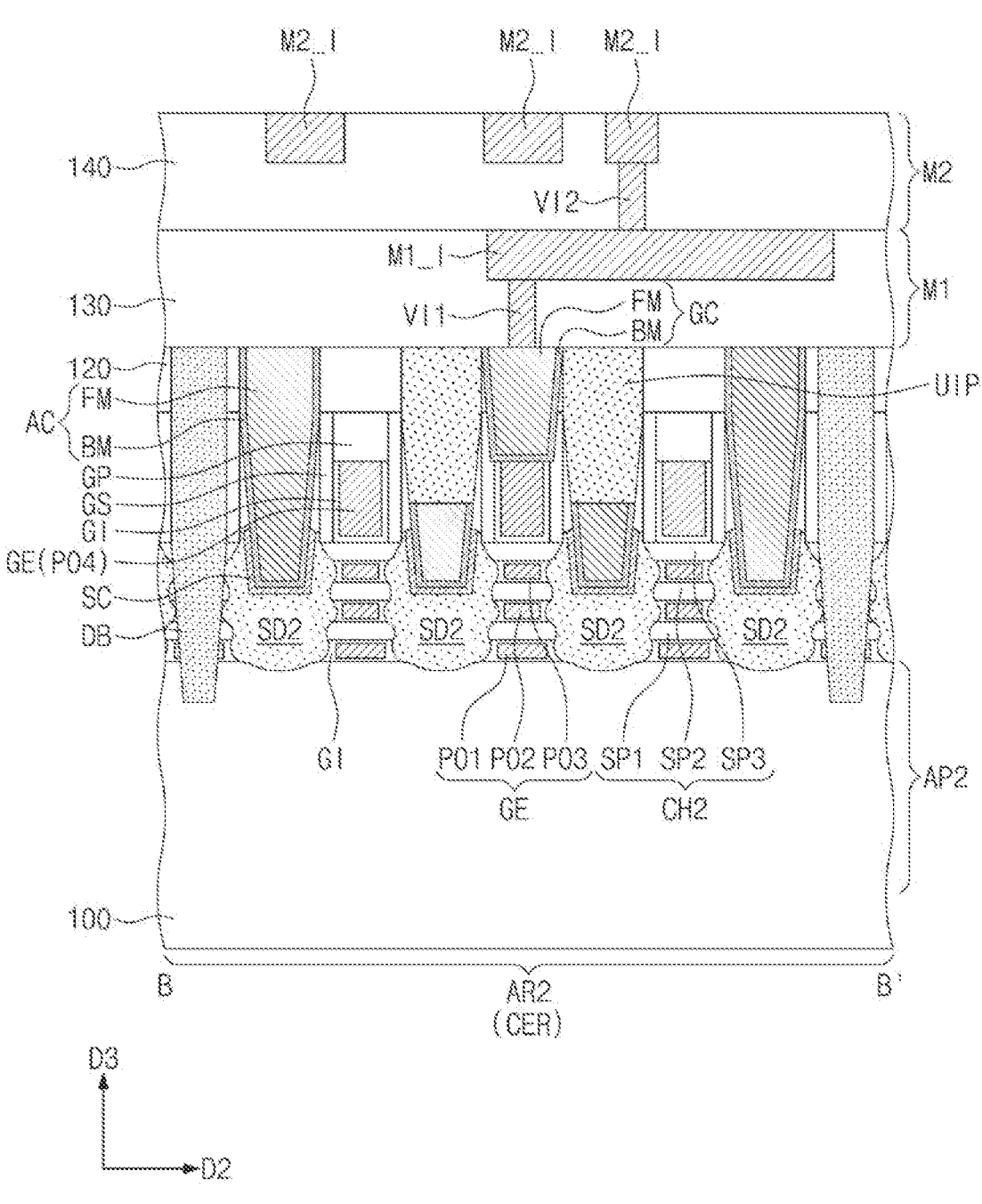
Figure 7C:
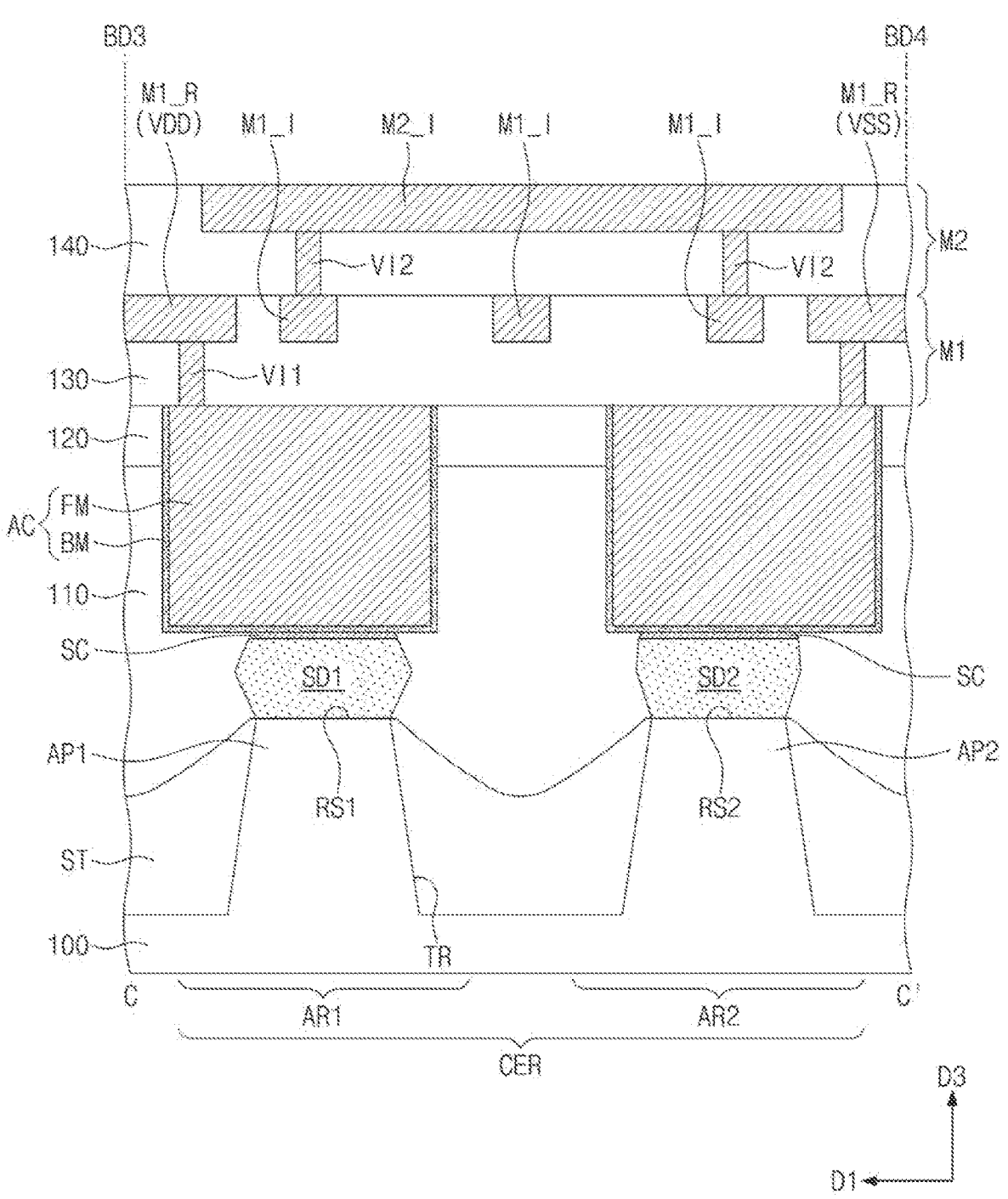
Figure 7D:
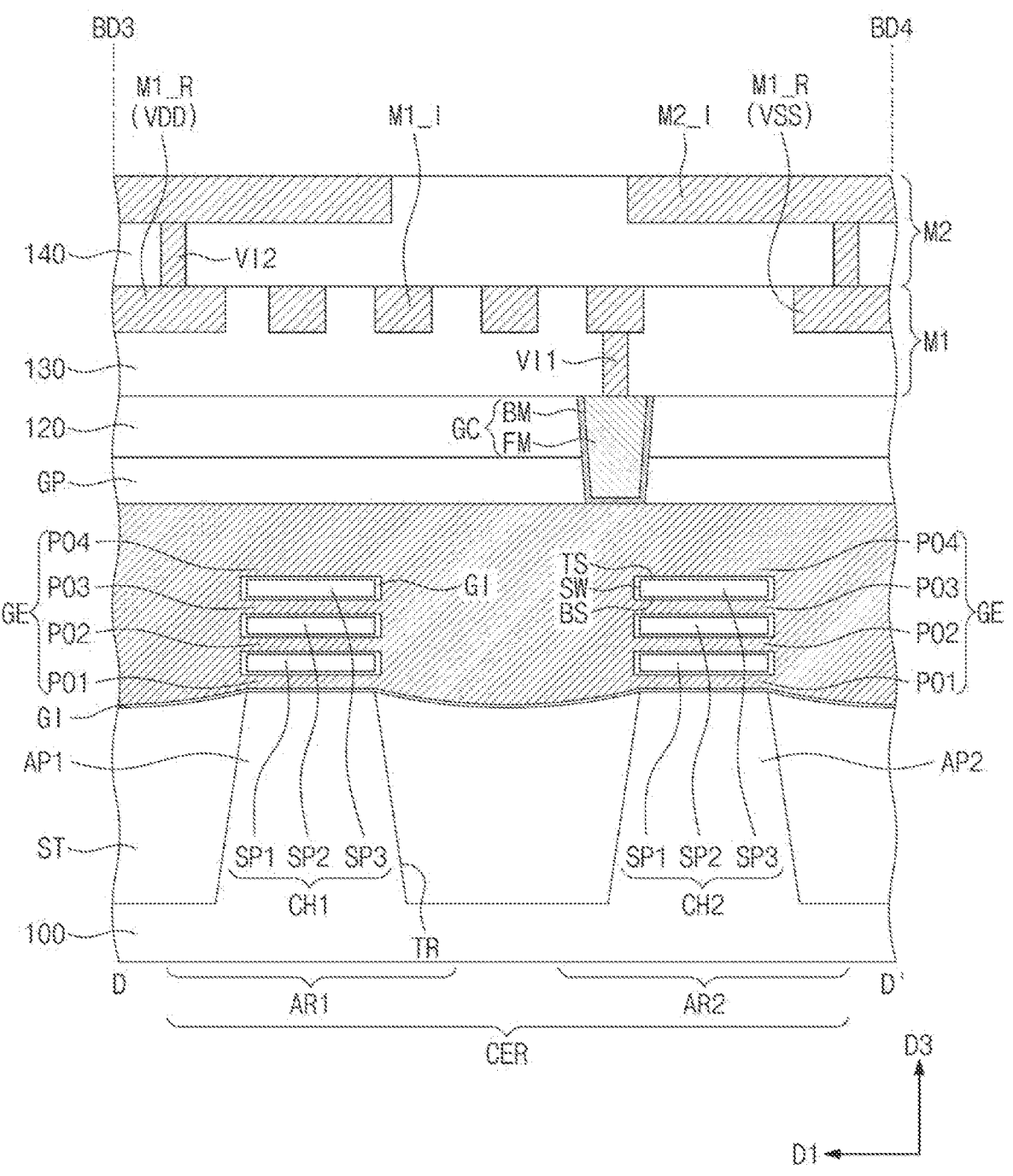

Referring to FIG. 7D, the gate electrode GE may be provided on a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

Referring back to FIGS. 6 and 7A to 7D, a pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. In an embodiment, the gate spacers GS may be formed of or may include at least one of SiCN, SiCON, or SiN. In another embodiment, the gate spacers GS may be a multi-layered structure, which is formed of or includes at least two different materials selected from SiCN, SiCON, and SiN.

A gate capping pattern GP may be provided on the gate electrode GE. The gate capping pattern GP may be extended lengthwise along the gate electrode GE or in the first direction D1. The gate capping pattern GP may be formed of or may include a material having an etch selectivity with respect to first and second interlayer insulating layers 110 and 120, which will be described below. In detail, the gate capping pattern GP may be formed of or may include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover a top surface of the device isolation layer ST below the gate electrode GE.

In an embodiment, referring to FIGS. 7A and 7B, the gate insulating layer GI may include an interface layer IL and a high-k dielectric layer HK. The interface layer IL may include a silicon oxide layer or a silicon oxynitride layer. The high-k dielectric layer HK may be formed of or may include a high-k dielectric material whose dielectric constant is higher than silicon oxide. As an example, the high-k dielectric layer HK may be formed of or may include at least one of, for example, hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

Referring back to FIGS. 6 and 7A to 7D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers which are stacked.

The second metal pattern may be formed of or may include a metallic material whose resistance is lower than the first metal pattern. For example, the second metal pattern may be formed of or may include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

The logic cell region CER may have a first boundary BD1 and a second boundary BD2, which are opposite to each other in the second direction D2. The first and second boundaries BD1 and BD2 may be extended lengthwise in the first direction D1. The logic cell region CER may have a third boundary BD3 and a fourth boundary BD4, which are opposite to each other in the first direction D1. The third and fourth boundaries BD3 and BD4 may be extended lengthwise in the second direction D2.

A pair of division structures DB, which are opposite to each other in the second direction D2, may be provided at both sides of the logic cell region CER. For example, the pair of the division structures DB may be respectively provided on the first and second borders BD1 and BD2 of the single height cell SHC. The division structure DB may be extended in the first direction D1 to be parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may electrically separate an active region of each of the single height cell SHC from an active region of a neighboring cell. For example, lower surfaces of the division structures DB may be lower than an upper surface of the substrate 100.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is extended lengthwise in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

Metal-semiconductor compound layers SC (e.g., silicide layers) may be respectively interposed between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. For example, the metal-semiconductor compound layer SC may be formed of or may include at least one of titanium silicide, tantalum silicide, tungsten silicide, nickel silicide, or cobalt silicide.

Gate contacts GC may be provided to penetrate the second interlayer insulating layer 120 and the gate capping pattern GP and to be electrically connected to the gate electrodes GE, respectively. When viewed in a plan view, the gate contacts GC may be disposed to be respectively overlapped with the first and second active regions AR1 and AR2. As an example, the gate contact GC may be provided on the second active pattern AP2 (e.g., see FIG. 7B).

In an embodiment, referring to FIG. 7B, an upper portion of the active contact AC adjacent to the gate contact GC may be filled with an upper insulating pattern UIP. A bottom surface of the upper insulating pattern UIP may be lower than a bottom surface of the gate contact GC. For example, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring therebetween.

Each of the active and gate contacts AC and GC may include a conductive pattern FM and a barrier pattern BM enclosing the conductive pattern FM. For example, the conductive pattern FM may be formed of or may include at least one of metallic materials (e.g., aluminum, copper, tungsten, molybdenum, and cobalt). The barrier pattern BM may cover side and bottom surfaces of the conductive pattern FM. In an embodiment, the barrier pattern BM may include a metal layer and a metal nitride layer. The metal layer may be formed of or may include at least one of titanium, tantalum, tungsten, nickel, cobalt, or platinum. The metal nitride layer may be formed of or may include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include a first power line M1_R1, a second power line M1_R2, and first interconnection lines M1_I. Each of the interconnection lines M1_R1, M1_R2, and M1_I of the first metal layer M1 may be extended lengthwise in the second direction D2 and in parallel to each other.

In detail, the first and second power lines M1_R1 and M1_R2 may be provided on the third and fourth boundaries BD3 and BD4, respectively, of the logic cell region CER. The first power line M1_R1 may be extended lengthwise along the third border BD3 and in the second direction D2. The second power line M1_R2 may be extended lengthwise along the fourth border BD4 and in the second direction D2. The first power line M1_R1 may be a path for providing a drain voltage VDD, for example, a power voltage. The second power line M1_R2 may be a path for providing a source voltage VSS, for example, a ground voltage.

The first interconnection lines M1_I of the first metal layer M1 may be disposed between the first and second power lines M1_R1 and M1_R2. The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first and second power lines M1_R1 and M1_R2.

The first metal layer M1 may further include first vias VI1. The first vias VI1 may be respectively disposed below the interconnection lines M1_R1, M1_R2, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended lengthwise in the first direction D1. For example, the second interconnection lines M2_I may be extended lengthwise in the first direction D1 and in parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or may include a conductive material that is the same as or different from those of the second metal layer M2. For example, the interconnection lines of the first and second metal layers M1 and M2 may be formed of or may include at least one of metallic materials (e.g., aluminum, copper, tungsten, ruthenium, molybdenum, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

Figure 7E:
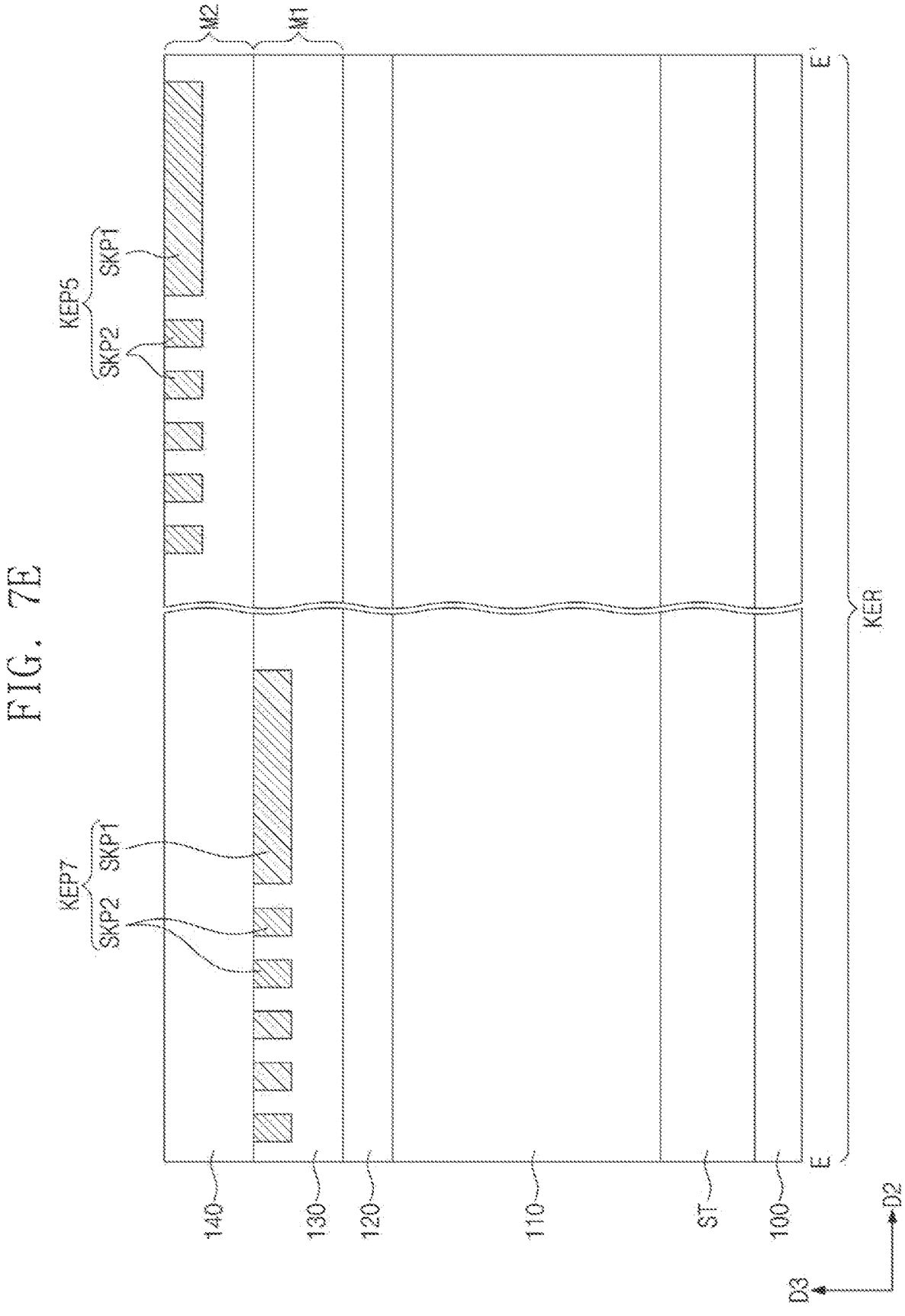

The overlay key region KER will be described in more detail with reference to FIGS. 6 and 7E. The overlay key region KER may include a plurality of the key patterns KEP, which are arranged in a honeycomb shape. The arrangement or disposition of the key patterns KEP may be substantially the same as that in the embodiment described with reference to FIG. 1. Each of the key patterns KEP may be disposed in the unit key region KCR.

The unit key region KCR may include the first and second sub-key patterns SKP1 and SKP2, the blank region BLKR, and the dummy region DMR including the dummy patterns CLP, as previously described with reference to FIG. 2.

The key patterns KEP of FIG. 6 may include the first to seventh key patterns KEP1-KEP7. The first to seventh key patterns KEP1-KEP7 may be disposed in the same layer or in at least two different layers. For example, referring to FIG. 7E, the seventh key pattern KEP7 may include the first and second sub-key patterns SKP1 and SKP2, which are provided in the first metal layer M1. The fifth key pattern KEP5 may include the first and second sub-key patterns SKP1 and SKP2, which are provided in the second metal layer M2. For example, the seventh key pattern KEP7 and the fifth key pattern KEP5 may be located at different levels.

In an embodiment, the seventh key pattern KEP7, which is formed in the first metal layer M1, may serve as an overlay key, which is used to align a photomask in a photolithography process to form the second metal layer M2. The fifth key pattern KEP5, which is formed in the second metal layer M2, may be used as an overlay key in a photolithography process for forming a third metal layer.

According to an example embodiment of the inventive concept, key patterns may be arranged in a honeycomb shape, and this may make it possible to minimize an area of an overlay key region and thereby to increase an integration density of a semiconductor device. Due to the honeycomb shape, it may be possible to secure a sufficient distance between adjacent ones of the key patterns, even when the area of the overlay key region is reduced. Accordingly, it may be possible to increase accuracy in a process of inspecting the key patterns and thereby to improve reliability in a semiconductor fabrication process.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate including an overlay key region; and
a plurality of key patterns on the overlay key region,
wherein the plurality of key patterns comprise first to seventh key patterns,
wherein the second to seventh key patterns are arranged to enclose the first key pattern in a clockwise direction and to have center points forming a hexagonal shape,
wherein one of the sides of the hexagon shape is offset from a center point of the first key pattern in a second direction by a first distance,
wherein a center point of the second key pattern is offset from the center point of the first key pattern in a first direction by a second distance,
wherein a ratio of half of the first distance to the second distance ranges from 1.4 to 1.8, and
wherein the second direction is perpendicular to the first direction.

2. The semiconductor device of claim 1,
wherein a first virtual line is defined to connect the center point of the first key pattern to the center point of the second key pattern,
wherein a second virtual line is defined to connect the center point of the first key pattern to the center point of the third key pattern,
wherein a third virtual line is defined to connect the center point of the second key pattern to the center point of the third key pattern, and
wherein a length of the first virtual line is substantially equal to a length of the third virtual line.

3. The semiconductor device of claim 2, wherein an angle between the first virtual line and the third virtual line ranges from 30° to 90°.

4. The semiconductor device of claim 1,
wherein a plurality of unit key regions are defined by boundaries between the plurality of key patterns,
wherein the plurality of key patterns are disposed in the unit key regions, respectively, and
wherein each of the unit key regions has a hexagonal shape.

5. The semiconductor device of claim 4, wherein each of the unit key regions comprises:
a dummy region enclosing the key pattern;
a blank region between the dummy region and the key pattern; and
dummy patterns in the dummy region,
wherein the dummy patterns are spaced apart from the key pattern with the blank region interposed therebetween.

6. The semiconductor device of claim 4,
wherein each of the plurality of unit key regions has a first width in a first direction and a second width in a second direction,
wherein a rectangular unit key region is defined to have the first width in the first direction and to have the same area as each of the plurality of unit key regions, and
wherein a third width of the rectangular unit key region in the second direction is smaller than the second width.

7. The semiconductor device of claim 6, wherein a ratio of the third width to the second width ranges from 0.7 to 0.9.

8. The semiconductor device of claim 1, wherein each of the plurality of key patterns has a rectangular shape, a hexagonal shape, or an octagonal shape.

9. The semiconductor device of claim 1, wherein the overlay key region is provided in a scribe lane.

10. The semiconductor device of claim 1, wherein the overlay key region is provided in a functional unit including a logic cell region.

11. A semiconductor device, comprising:
a substrate including an overlay key region; and
a plurality of key patterns on the overlay key region,
wherein the plurality of key patterns comprise:
a first column including first key patterns arranged in a first direction; and
a second column including second key patterns arranged in the first direction,
wherein a center point of a first one of the second key patterns of the second column is offset from a center point of a first one of the first key patterns of the first column in a second direction by a first distance,
wherein the center point of the first one of the second key patterns of the second column is offset from the center point of the first one of the first key patterns of the first column corresponding thereto in the first direction by a second distance, and
wherein a ratio of the first distance to the second distance ranges from 1.4 to 1.8.

12. The semiconductor device of claim 11, wherein the first column and the second column are repeatedly arranged in the second direction.

13. The semiconductor device of claim 11, wherein a pitch between the first key patterns is substantially equal to a distance between the center point of the Erst one of the second key patterns and the center point of the first one of the first key patterns corresponding thereto.

14. The semiconductor device of claim 11,
wherein a plurality of unit key regions are defined by boundaries between the plurality of key patterns,
wherein the plurality of key patterns are disposed in the unit key regions, respectively, and wherein each of the unit key regions has a hexagonal shape.

15. The semiconductor device of claim 14, wherein each of the unit key regions comprises:

a dummy region enclosing the key pattern;

a blank region between the dummy region and the key pattern; and dummy patterns in the dummy region, wherein the dummy patterns are spaced apart from the key pattern with the blank region interposed therebetween.

16. A semiconductor device, comprising:

a substrate including a logic cell region and an overlay key region;

an active pattern on the logic cell region;

a source/drain pattern and a channel pattern on the active pattern;

a gate electrode crossing the channel pattern;

an active contact electrically connected to the source/ drain pattern;

a gate contact electrically connected to the gate electrode;

a first metal layer electrically connected to the active contact and the gate contact;

a second metal layer on the first metal layer; and a plurality of key patterns on the overlay key region, wherein a plurality of unit key regions are defined by boundaries between adjacent sides of the plurality of key patterns, wherein the plurality of key patterns are disposed in the plurality of unit key regions, respectively, wherein each of the plurality of unit key regions has a hexagonal shape, wherein the plurality of key patterns comprise a first column including first patterns arranged in a first direction and a second column including second key patterns arranged in the first direction, wherein a center point of a first one of the second key patterns of the second column is offset from a center point of a first one of the first key patterns of the first column in a second direction by a first distance, wherein one of the sides of the hexagon shape is offset from a center point of one of the key patterns in the first direction by a second distance, wherein a ratio of the first distance to the second distance ranges from 1.4 to 1.8, and wherein the second direction is perpendicular to the first direction.

17. The semiconductor device of claim 16, wherein the unit key regions are arranged to be in contact with each other, and the key patterns are arranged in a honeycomb shape.

18. The semiconductor device of claim 16, wherein one of the key patterns comprises first sub-key patterns, which are disposed at the same level as the first metal layer, and wherein another of the key patterns comprises second sub-key patterns, which are disposed at the same level as the second metal layer.

19. The semiconductor device of claim 16, wherein each of the plurality of unit key regions has a first width in a first direction and a second width in a second direction, wherein a rectangular unit key region is defined to have the first width in the first direction and to have the same area as each of the plurality of unit key regions, and wherein a third width of the rectangular unit key region in the second direction is smaller than the second width.

20. The semiconductor device of claim 16, wherein each of the unit key regions comprises:

a dummy region enclosing the key pattern;

a blank region between the dummy region and the key pattern; and dummy patterns in the dummy region, and wherein the dummy patterns are spaced apart from the key pattern with the blank region interposed therebetween.

\* \* \* \* \*